US010395701B1

(12) United States Patent
Ho et al.

(10) Patent No.: US 10,395,701 B1
(45) Date of Patent: Aug. 27, 2019

(54) MEMORY DEVICE WITH A LATCHING MECHANISM

(71) Applicant: Micron Technology, Inc., Boise, ID (US)

(72) Inventors: Michael V. Ho, Allen, TX (US); Vijayakrishna J. Vankayala, Allen, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/975,716

(22) Filed: May 9, 2018

(51) Int. Cl.
*G11C 7/22* (2006.01)
*G11C 11/4063* (2006.01)
*G11C 7/10* (2006.01)

(52) U.S. Cl.
CPC ............ *G11C 7/222* (2013.01); *G11C 7/1087* (2013.01); *G11C 7/1096* (2013.01); *G11C 7/225* (2013.01); *G11C 11/4063* (2013.01)

(58) Field of Classification Search
CPC .................................. G11C 7/222; G11C 7/22
USPC ........................................... 365/189.05, 193
See application file for complete search history.

(56) References Cited

U.S. PATENT DOCUMENTS

| | | | | | |
|---|---|---|---|---|---|
| 6,154,494 | A * | 11/2000 | Sugahara | ............ | H04N 21/2365 341/67 |
| 6,889,334 | B1 * | 5/2005 | Magro | ................. | G11C 7/1051 324/130 |
| 7,057,430 | B2 * | 6/2006 | Ogiso | .................... | H03B 5/326 327/156 |
| 7,162,207 | B2 * | 1/2007 | Kursula | ................. | H04B 17/15 370/247 |
| 7,356,723 | B2 * | 4/2008 | LaBerge | ............. | G06F 13/1689 713/401 |
| 7,558,131 | B2 * | 7/2009 | Han | ....................... | G11C 7/1078 365/189.04 |
| 8,803,610 | B2 * | 8/2014 | Ikehata | .................... | G11C 7/10 330/259 |
| 9,117,509 | B2 * | 8/2015 | Wen | .......................... | G11C 8/18 |
| 9,152,594 | B2 * | 10/2015 | Kaiwa | ................. | G06F 13/4059 |
| 9,535,451 | B2 * | 1/2017 | Shin | ........................... | G06F 1/12 |
| 9,618,575 | B2 * | 4/2017 | Miyaji | ............... | G01R 31/2894 |
| 9,953,700 | B2 * | 4/2018 | Kim | ....................... | G11C 11/419 |
| 10,199,081 | B1 * | 2/2019 | Asaki | ........................ | G11C 7/12 |
| 10,218,340 | B2 * | 2/2019 | Ichida | ..................... | H03K 5/134 |
| 2001/0050588 | A1 * | 12/2001 | Redman-White | ........ | G06G 7/14 327/361 |
| 2004/0202082 | A1 * | 10/2004 | Sako | ................... | G11B 20/1426 369/59.24 |
| 2006/0203573 | A1 * | 9/2006 | Kim | ....................... | G11C 7/1051 365/193 |
| 2007/0002644 | A1 * | 1/2007 | Kang | ..................... | G11C 7/1006 365/193 |
| 2007/0239921 | A1 * | 10/2007 | Toorians | ............... | G06F 1/1616 710/306 |

(Continued)

*Primary Examiner* — Michael T Tran
(74) *Attorney, Agent, or Firm* — Perkins Coie LLP

(57) ABSTRACT

A memory device includes a timing circuit configured to: receive an input signal, wherein the input signal is one signal within a group of input signals (e.g., multiple bits or nibbles) that are communicated according to a sequence with each of the input signals individually in serial to parallel operations, and generate a grouped latching timing signal based on the received input signal, wherein the timing signal corresponds to nibbles of the data.

20 Claims, 6 Drawing Sheets

(56) References Cited

U.S. PATENT DOCUMENTS

| | | | |
|---|---|---|---|
| 2008/0065929 A1* | 3/2008 | Nadeau-Dostie | G11C 29/4401 714/5.11 |
| 2009/0016119 A1* | 1/2009 | Jang | G11C 7/1012 365/189.02 |
| 2009/0039927 A1* | 2/2009 | Gillingham | G06F 13/1694 327/156 |
| 2009/0091992 A1* | 4/2009 | Lee | G11C 7/1066 365/193 |
| 2009/0168547 A1* | 7/2009 | Lee | G11C 7/1078 365/189.05 |
| 2009/0168548 A1* | 7/2009 | Na | G11C 7/1051 365/189.05 |
| 2010/0008167 A1* | 1/2010 | Shin | G11C 7/1066 365/194 |
| 2010/0329007 A1* | 12/2010 | Chibvongodze | G11C 7/103 365/185.05 |
| 2011/0161568 A1* | 6/2011 | Bruce | G06F 12/00 711/103 |
| 2011/0280090 A1* | 11/2011 | Matsubara | G11C 29/08 365/193 |
| 2014/0055184 A1* | 2/2014 | Vankayala | G06F 1/12 327/161 |
| 2014/0208149 A1* | 7/2014 | Canac | G06F 13/4217 713/401 |
| 2015/0063000 A1* | 3/2015 | Takahashi | G11C 17/16 365/96 |
| 2015/0098275 A1* | 4/2015 | Kim | G11C 16/26 365/185.18 |
| 2016/0162404 A1* | 6/2016 | Lee | G11C 7/1066 711/120 |
| 2017/0070219 A1* | 3/2017 | Ichida | H03K 5/134 |
| 2017/0214403 A1* | 7/2017 | Arai | H03K 19/0013 |
| 2017/0270982 A1* | 9/2017 | Song | G11C 7/22 |
| 2017/0323678 A1* | 11/2017 | Kim | G11C 11/419 |
| 2018/0053538 A1* | 2/2018 | Miyano | G11C 7/1057 |
| 2018/0131393 A1* | 5/2018 | Yamamoto | H03M 13/45 |
| 2018/0285013 A1* | 10/2018 | Rajan | G06F 13/1678 |
| 2019/0068218 A1* | 2/2019 | Sadowski | H03M 7/6047 |
| 2019/0121577 A1* | 4/2019 | Mazumder | G06F 3/0659 |

* cited by examiner

MEMORY DEVICE WITH A LATCHING MECHANISM

TECHNICAL FIELD

The disclosed embodiments relate to memory devices, and, in particular, to memory devices with a latching mechanism.

BACKGROUND

Memory systems can employ memory devices to store and access information. The memory devices can include volatile memory devices, non-volatile memory devices, or a combination device. Memory devices, such as dynamic random-access memory (DRAM), can utilize electrical energy to store and access data. Some memory devices can include vertically stacked dies (e.g., die stacks) that are connected using Through-Silicon-Vias (TSVs) in a master-slave (MS) configuration. For example, the memory devices can include Double Data Rate (DDR) RAM devices that implement DDR interfacing scheme for high-speed data transfer. The DDR RAM devices (e.g., DDR4 devices, DDR5 devices, etc.) can include memory chips that include die stacks that each include a master device and one or more slave device.

As illustrated in FIG. 1, a memory device 102 (e.g., DDR DRAM device) can be electrically coupled to a controller 103 (e.g., a memory controller, a central processing unit (CPU), etc.). The memory device 102 can respond to commands from the controller 103 and perform memory-related operations, such as reads or writes.

As discussed above, the memory device 102 can be a stacked device. As such, the memory device 102 can include a master device 104 and a set of slave devices 106. For example, the memory device 102 can be a 2H, a 4H, an 8H, or a 16H (e.g., two/four/eight/sixteen total dies with three/seven/fifteen slave dies) device. For the stacked device, the controller 103 can write to or read from the slave devices 106, but to do so, the controller 103 can communicate to/through the master device 104. For example, the master device 104 can include input/output (I/O) pads 112 and/or I/O buffers 114 used to communicate with an external device (e.g., the controller 103). The master device 104 can also include an operational logic 116 (e.g., control/read/write logic) configured to facilitate/communicate the commands/operations. The memory device 102 can include TSVs 122 electrically coupling the master device 104 and the slave devices 106. The master device 104 can communicate with the controller 103 for implementing the commands/operations.

The master device 104 and/or the slave devices 106 can each include core test logic 132 configured to facilitate the testing of the die. Additionally, the master device 104 and/or the slave devices 106 can each include operational core 134 configured to carry out the operations, such as the memory operations.

FIG. 2 illustrates a block diagram of a memory device 200 (e.g., the memory device 102 or a portion thereof). The memory device 200 can include a strobe circuit 202, a latch circuit 204, etc. The strobe circuit 202 can be configured to receive/process a data strobe set 210, such as for a set of clock signals. The latch circuit 204 (e.g., a serial-to-parallel first-in first-out (FIFO) device/buffer) can convert a format/sequence of the received data signal.

For example, for write cycles, the intended write data (data input set) can be communicated in bursts/groups (e.g., groups of four data bits, and in some cases, two additional bits for cyclic redundancy check (CRC) information). The strobe circuit 202 can internally generate/communicate the data strobe set 210 that act as clock signals for latching/converting the received/data signal at the latch circuit 204.

The strobe circuit 202, the latch circuit 204, etc. can include components dedicated/configured to single data segment (e.g., bit) within the data strobe set 210. For example, the data strobe set 210 can include a first strobe signal 211 (DQS2), a second strobe signal 212 (DQS3), a third strobe signal 213 (DQS6), a fourth strobe signal 214 (DQS7), a fifth strobe signal 215 (DQS8), a sixth strobe signal 216 (DQS9), etc. Accordingly, the strobe circuit 202 can include a first timing circuit 221 corresponding to the first strobe signal 211, a second timing circuit 222 corresponding to the second strobe signal 212, a third timing circuit 223 corresponding to the third strobe signal 213, a fourth timing circuit 224 corresponding to the fourth strobe signal 214, a fifth timing circuit 225 corresponding to the fifth strobe signal 215, a sixth timing circuit 226 corresponding to the sixth strobe signal 216, etc.

The latch circuit 204 can include a first latch 241, a second latch 242, a third latch 243, a fourth latch 244, a fifth latch 245, a sixth latch 246, etc. each configured to latch a component/portion of a data input set 250 (e.g., intended write data or write payload). For example, the first latch 241, the second latch 242, the third latch 243, the fourth latch 244, the fifth latch 245, the sixth latch 246, etc. can latch a first data 251, a second data 252, a third data 253, a fourth data 254, a fifth data 255, a sixth data 256, etc. respectively. Each of the latches can receive the corresponding strobe signal (e.g., the first strobe signal 211, the second strobe signal 212, the third strobe signal 213, the fourth strobe signal 214, the fifth strobe signal 215, the sixth strobe signal 216, etc. respectively) and use it to latch the data signals.

For some DRAM devices, burst operations and page-gapless operations can be implemented for various operations, such as during write cycles. Accordingly, the devices can communicate multiple bits in groups/bursts for the operations. The information (e.g., bits) communicated during the bursts (e.g., eight data bits or strings of data bits) can be continuously processed, such as based on a serial-to-parallel conversion. Each of the communicated bit can correspond to relative timings (e.g., data strobe clocks or DQS) that require certain characteristics (e.g., setup time and hold time). At high frequencies, the windows for these critical times become narrower. Further, when the device is a stacked master/slave device that includes multiple stacked dies, signals for all of the slave devices flow through the master device. The signals can have various timing/waveform discrepancies, such as due to power bus noise, signal couplings, data propagation, process/temperature/voltage variations, etc. in circuits.

The variations in timing/waveform shapes, etc. can further reduce the effectiveness of the critical times as they are processed through the master device with stacks of slave devices' parasitic resistance and capacitance loadings. For example, the strobe signals (e.g., DQS 2/3/6/7/8/9/etc.) and the data (e.g., DQ 1/2/3/4/5/6/etc.) can be sent from the master device to the slave devices. If the DRAM device is 2H/4H/8H/16H, the increased number of devices within a stack will increase the overall resistance and capacitive loading that will introduce variations. The master device and each of the slave devices have their own variations resulting from process/voltage/temperature (PVT), where the variations further reduce the setup time and the hold time.

Moreover, variations can occur between each of the strobe signals, such as between DQS2 and DQS3.

DETAILED DESCRIPTION

As described in greater detail below, the technology disclosed herein relates to memory devices, systems with memory devices, and related methods for communicating data signals between dies. For a set of data (e.g., four bits and/or two CRC bits) communicated during a burst operation/communication, such as for a write cycle, the memory devices (e.g., DDR DRAMs) can receive/process the data using subgroupings (e.g., groups of two bits or nibbles) instead of one bit at a time. For example, the memory devices can latch two or more bits at a time based on different data strobe clocks (DQS). Accordingly, the memory devices can reduce the number of clock signals (e.g., latching signals) by a corresponding factor (e.g., two or more). The reduction in the number of clock signals can provide increased window for critical times in comparison to single bit reception/latching scheme. Accordingly, the reduction in the clock transitions can increase the timing windows of latching groups of bits (e.g., nibbles) of the data instead of each bit at very high frequency, and thus, improve the critical timings (e.g., setup time and hold time) as master device sees more parasitic resistance and capacitance loadings from slave devices. Further, the reduction reduces bit-to-bit variations to reduce power consumptions by grouping latching signals more effectively.

For some DRAM devices, burst operations and page gapless operations can be implemented for write cycles. Accordingly, the devices can communicate multiple bits in groups/bursts for the write operations. The information (e.g., bits) communicated during the bursts (e.g., eight data bits or strings of data bits) can be continuously latched in serial-to-parallel first-in first-out (FIFO) device/buffer for write cycles. Each bit can correspond to relative timings between data and data strobe clocks (e.g., DQS). For example, the relative timings can include setup time and hold time. However, at high frequencies, the windows for these critical times become narrower. Further, when the device is a stacked master/slave device (e.g., 4, 8, or 16 dies in stack through TSV), signals for all of the slave devices flow through the master device. The signals can have various timing/waveform discrepancies, such as due to power bus noise, signal couplings, data propagation, process/temperature/voltage variations, etc. in circuits. The variations in timing/waveform shapes, etc. can further reduce the effectiveness of the critical times as they are processed through the master device.

Figure 3:
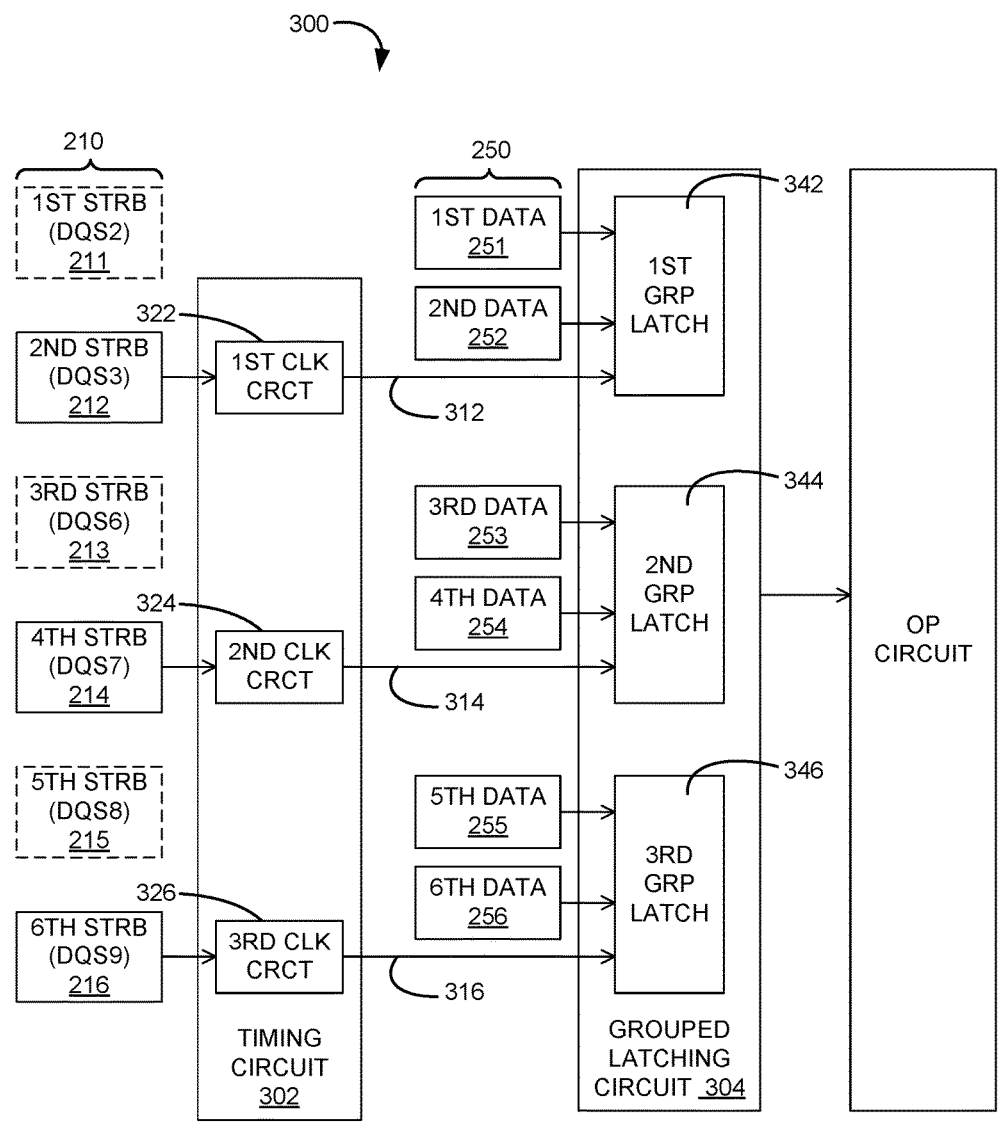
FIG. 3 illustrates a block diagram of a memory device in accordance with an embodiment of the present technology.

FIG. 3 illustrates a block diagram of a memory device 300 (e.g., a DRAM device, such as a stacked-die package) in accordance with an embodiment of the present technology. The memory device 300 (e.g., DDR based DRAM) can be configured to process groupings or subsets of clock signals (e.g., DQS) instead of processing/latching them one bit at a time. In some embodiments, the memory device 300 can include a timing circuit 302, a grouped latching circuit 304, etc. coupled to an operation circuit. The timing circuit 302 can be configured to generate timing signals for processing/latching groupings/subsets of data. The grouped latching circuit 304 (e.g., a serial-to-parallel first-in first-out (FIFO) device/buffer) can convert a format/sequence of the received groupings/subsets of data for processing by the operation circuit.

For write cycles, the data input set 250 or a portion thereof can be communicated to the memory device 300 in bursts/groups (e.g., groups of four data bits, and in some cases, two additional CRC bits). Instead of utilizing the data strobe set 210 for one-bit based processing, the memory device 300 can process groupings/subsets (e.g., two or more bits at a time) in the data input set 250. Accordingly, the timing circuit 302 can generate a set of clock signals used to control a timing for latching/converting the data input set 250 at the grouped latching circuit 304.

For example, the timing circuit 302 can include a first clock circuit 322, a second clock circuit 324, and a third clock circuit 326 configured to generate timing signals for processing two-bit segments (e.g., nibbles) of the data. The timing circuit 302 can generate the timing signals based on a portion or a subset of the data strobe set 210 (e.g., every other DQS, every third DQS, etc.). In some embodiments, the first clock circuit 322 can generate a first clock signal 312, the second clock circuit 324 can generate a second clock signal 314, and the third clock circuit 326 can generate a third clock signal 316. The first clock signal 312 can be based on the second strobe signal 212 (e.g., based on a rising/falling edge thereof). Similarly, the second clock signal 314 can be based on the fourth strobe signal 214 and the third clock signal 316 can be based on the sixth strobe signal 216. The memory device 300 can ignore the other remaining strobe signals (e.g., the first strobe signal 211, the third strobe signal 213, the fifth strobe signal 215, etc.) in generating the timing signals.

Similarly, the grouped latching circuit 304 can include a first group latch 342, a second group latch 344, and a third group latch 346 each configured to latch groupings of data (e.g., two-bit segments or nibbles) of the data. In some embodiments, the grouped latching circuit 304 (e.g., in the first group latch 342, the second group latch 344, the third group latch 346, etc.) can include one or more phase splitters configured to generate the timing signal based on the received input signal (e.g., the data strobe). The grouped latching circuit 304 can include the one or more phase splitters instead of one or more buffers (e.g., transmitters), such as utilized in the memory device 200.

The grouped latching circuit 304 can latch each grouping based on one of the timing signals. For example, the first group latch 342 can latch a first nibble (e.g., the first data 251 and the second data 252) of the data input set 250 based on the first clock signal 312. Similarly, the second group latch 344 can latch the second nibble (e.g., the third data 253 and the fourth data 254) based on the second clock signal 314, and the third group latch 346 can latch the third nibble/CRC data (e.g., the fifth data 255 and the sixth data 256).

For illustrative purposes, the memory device 300 is discussed as processing 2-bit groupings. However, it is understood that the memory device 300 can process/latch 3 or more bits at a time using corresponding timing signals and circuits.

Figure 4:
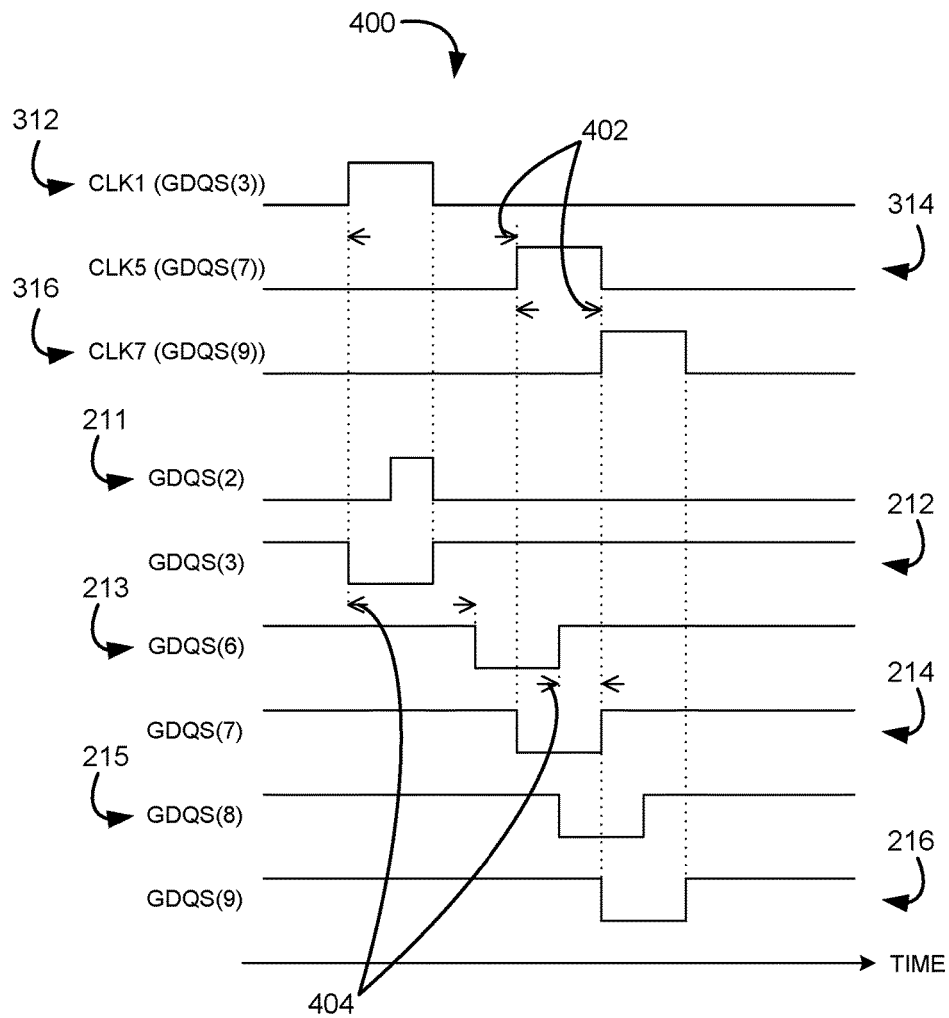
FIG. 4 illustrates a timing diagram for a memory device in accordance with an embodiment of the present technology.

FIG. 4 illustrates a timing diagram 400 for a memory device (e.g., the memory device 300 of FIG. 3) in accordance with an embodiment of the present technology. The timing diagram 400 can show the timing of the first clock signal 312 (e.g., a signal in a phase split pair of GDQS(3)), the second clock signal 314 (e.g., a signal in a phase split pair of GDQS(7)), and the third clock signal 316 (e.g., a signal in a phase split pair of GDQS(3)), in comparison to the device's global clock/strobe signals, such as the first strobe signal 211, the second strobe signal 212, the third strobe signal 213, the fourth strobe signal 214, the fifth strobe signal 215, and the sixth strobe signal 216.

For example, one of more of the edges (e.g., the rising edge and/or the falling edge) of the first clock signal 312 can correspond to one or more edges (e.g., the rising edge and/or the falling edge) of the second strobe signal 212. Similarly, the second clock signal 314 can correspond to the fourth strobe signal 214, and the third clock signal 316 can correspond to the sixth strobe signal 216. As illustrated in FIG. 4, the corresponding signals can overlap with the edges aligning/occurring simultaneously or close in time.

Since the memory device uses a smaller set of timing signals in comparison to the strobe set, a delay/separation between adjacent signals can be greater than that of the strobe signals. For example, a timing signal separation 402 (e.g., a duration between consecutive timing signals) can be greater than an input separation 404 (e.g., a duration between consecutive strobe signals). As such, critical timing parameters (e.g., set-up and/or hold timings) for the clock signals can have greater tolerance/window than the strobe signals. As a result, the timing circuit 302 generating the timing signals used to latch groupings of bits provides better performance (e.g., lower error rates) and higher yield.

Figure 5:
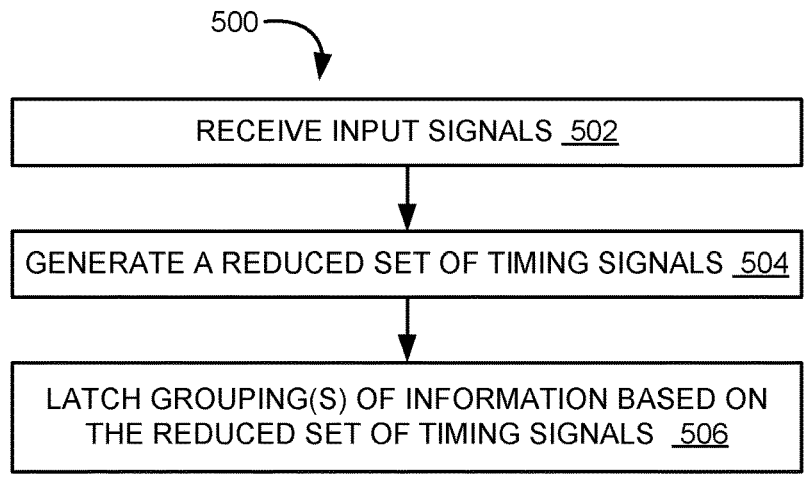
FIG. 5 illustrates a flow diagram illustrating an example method of operating the memory device of FIG. 3 in accordance with an embodiment of the present technology.

FIG. 5 illustrates a flow diagram 500 illustrating an example method of operating the memory device 300 of FIG. 3 in accordance with an embodiment of the present technology. The example method can be for operating a mono die device or a stacked die device (e.g., a master die, a slave die, etc. within the stacked die device). The example method can correspond to the timing diagram 400 of FIG. 4. Also, the example method can be for processing groupings of data/information/bits based on a reduced set of timing signals for data operations, such as for read or write operations, address/command/data communication and processing, etc.

Figure 1:
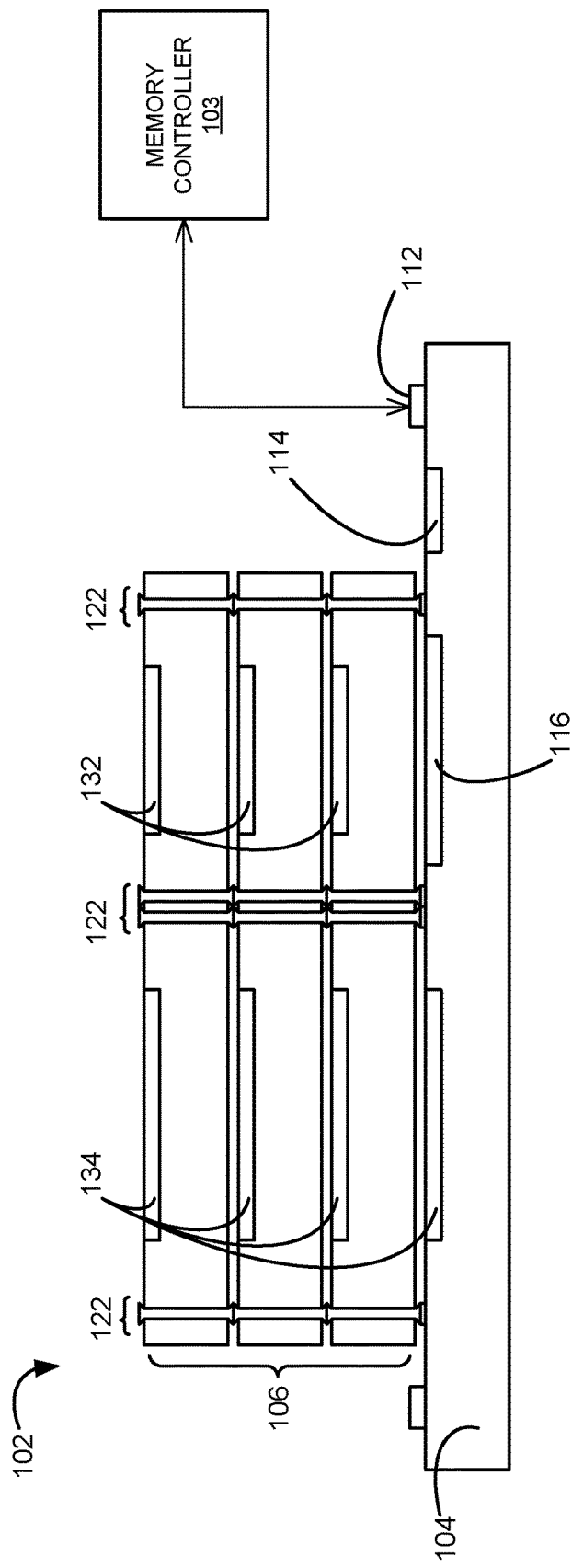
FIG. 1 is a cross-sectional view of a memory device.
Figure 2:
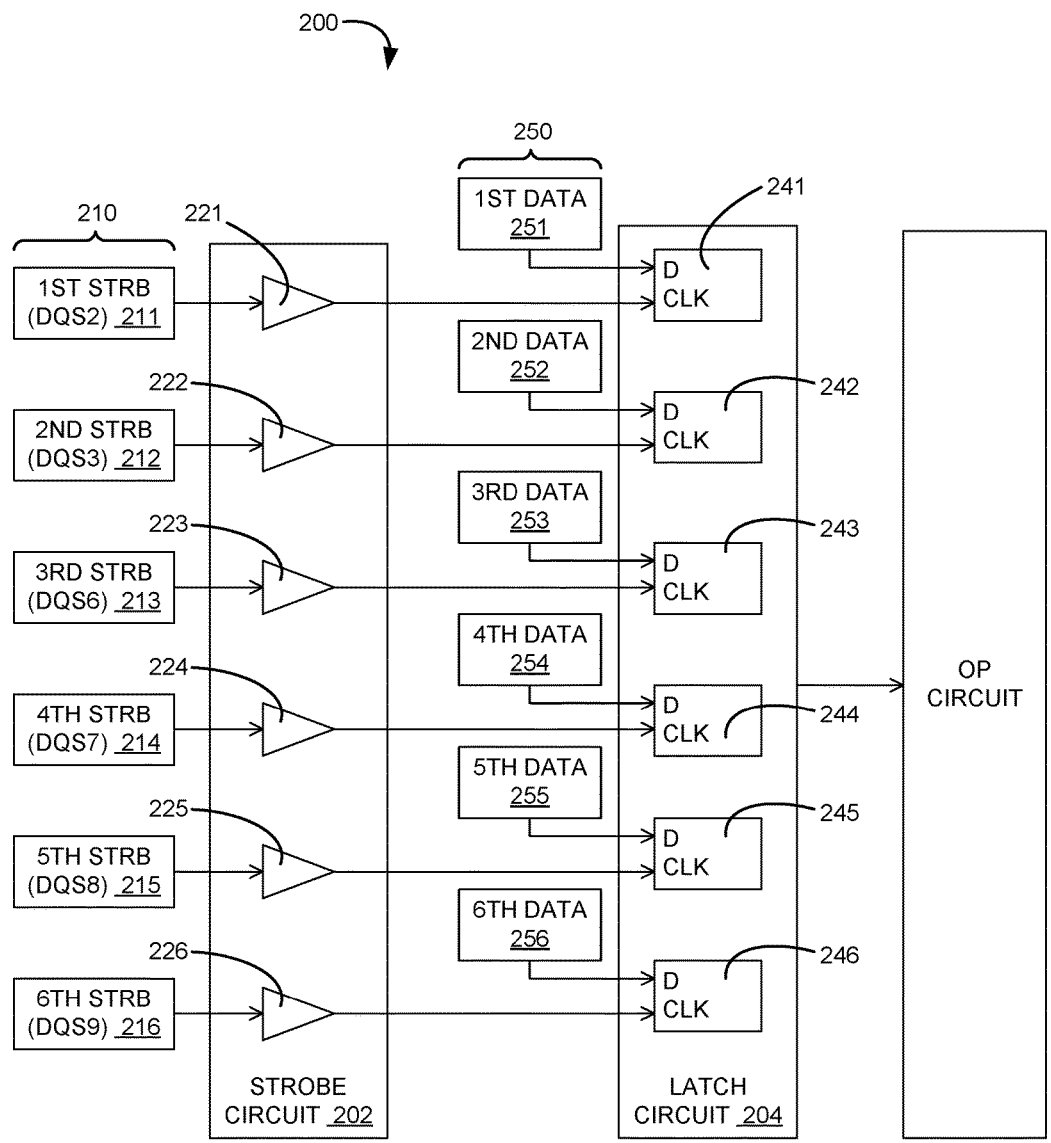
FIG. 2 illustrates a block diagram of a memory device.

At box 502, the memory device 300 can receive a set of input signals (e.g., the data strobe set 210 of FIG. 2) that include two or more signals. For example, the memory device 300 (e.g., at the timing circuit 302 of FIG. 3) can receive at least two of the first strobe signal 211, the second strobe signal 212, the third strobe signal 213, the fourth strobe signal 214, the fifth strobe signal 215, the sixth strobe signal 216, etc., all of FIG. 2. The input signals can be received in a sequential manner. The received input signals can each correspond to a portion (e.g., a bit) of data (e.g., read or write data/payload, address, command, etc.). The memory device 300 can receive the input signals (e.g., one or more pairs of consecutive signals) that are separated in time by the input separation 404 of FIG. 4.

At box 504, the memory device 300 can generate a reduced set of timing signals (e.g., including a smaller number signals than the data strobe set 210). For example, the memory device 300 (e.g., at the timing circuit 302) can generate the first clock signal 312, the second clock signal 314, the third clock signal 316, etc., all of FIG. 3. The memory device 300 can generate the timing signals based on and/or for replacing the corresponding input/DQS signal. Accordingly, the memory device 300 can generate the first clock signal 312 based on and/or for replacing the first strobe signal 211 and the second strobe signal 212, the second clock signal 314 based on and/or for replacing the third strobe signal 213 and the fourth strobe signal 214, the third clock signal 316 based on and/or for replacing the fifth strobe signal 215 and the sixth strobe signal 216, etc.

In some embodiments, the memory device 300 can generate the timing signals based on last occurring input signal within each grouping. The memory device 300 can otherwise ignore the preceding input signals within each groupings in generating the input signals. For example, the memory device 300 can ignore the first strobe signal 211 and generate the first clock signal 312 triggered based on the second strobe signal 212. Similarly, the memory device 300 can ignore the third strobe signal 213 and generate the second clock signal 314 triggered based on the fourth strobe signal 214. Also, the memory device 300 can ignore the fifth strobe signal 215 and generate the third clock signal 316 based on the sixth strobe signal 216. As a result, the memory device 300 can generate the timing signals separated by the timing signal separation 402 of FIG. 4 that is greater/longer than the input separation 404.

At box 506, the memory device 300 (e.g., e.g., the grouped latching circuit 304 of FIG. 3) can process/latch the data/payload (the data input set 250 of FIG. 2) based on the timing signal(s). For example, based on the first clock signal 312, the memory device 300 (e.g., the first group latch 342 of FIG. 3) can latch the first two bits (e.g., the first data 251 and the second data 252, both of FIG. 2 or the first nibble) of the data input set 250. Similarly, based on the second clock signal 314, the memory device 300 (e.g., the second group latch 344 of FIG. 3) can latch the next two bits (e.g., the third data 253 and the fourth data 254, both of FIG. 2, or the second nibble) of the data input set 250. Also, based on the third clock signal 316, the memory device 300 (e.g., the third group latch 346 of FIG. 3) can latch the next two bits (e.g., the fifth data 255 and the sixth data 256, both of FIG. 2, or the third nibble) of the data input set 250. The first data 251, the second data 252, the third data 253, the fourth data 254, the fifth data 255, and the sixth data 256 can correspond to or match the first strobe signal 211, the second strobe signal 212, the third strobe signal 213, the fourth strobe signal 214, the fifth strobe signal 215, and the sixth strobe signal 216, respectively.

Figure 6:
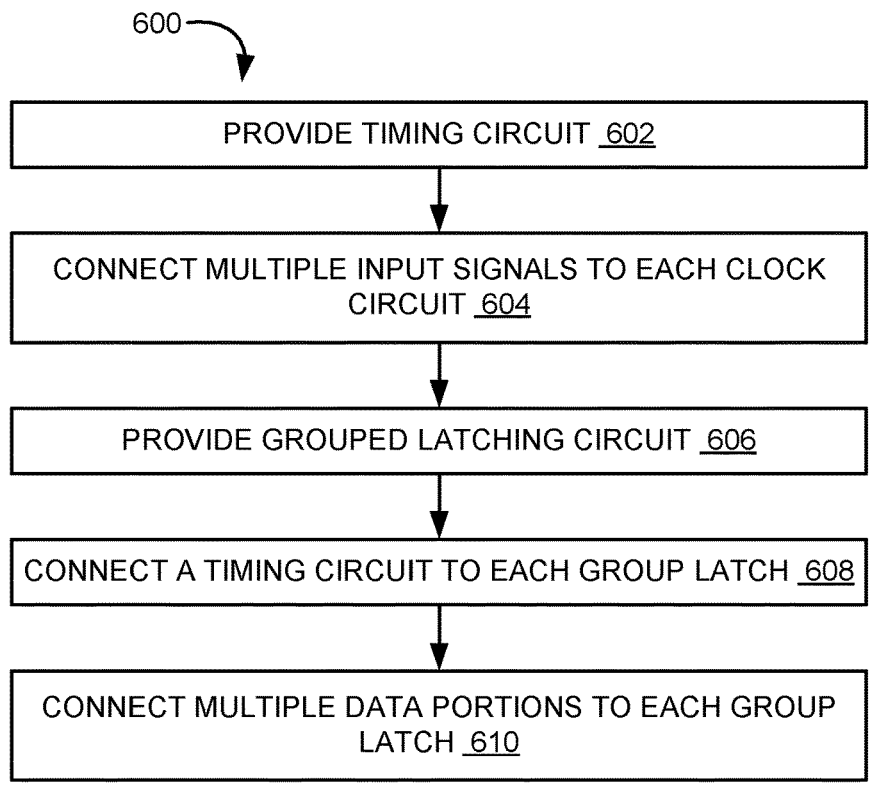
FIG. 6 illustrates a flow diagram illustrating an example method of manufacturing the memory device of FIG. 3 in accordance with an embodiment of the present technology.

FIG. 6 illustrates a flow diagram illustrating an example method 600 of manufacturing the memory device 300 of FIG. 3 in accordance with an embodiment of the present technology. The method 600 can be for manufacturing the memory device 300 (e.g., a mono-die device or a stacked device) configured to generate timing signals that each replace multiple input signals and operate on a group of bits/data portions.

At block 602, the method 600 can include providing a timing circuitry (e.g., the timing circuit 302 of FIG. 3). For example, the timing circuit 302 can be provided with clock circuits (e.g., the first clock circuit 322, the second clock circuit 324, the third clock circuit 326, etc.) that are each dedicated to a grouping (e.g., groupings of two or more signals) of input signals (e.g., the data strobe set 210 of FIG. 2) and/or a grouping of data portions/bits (e.g., the data input set 250 of FIG. 2, such as read/write payload, address, commands, etc.). Each of the clock circuits can be configured to generate a timing signal that correspond to a grouping of the input signals.

In some embodiments, providing the timing circuitry can include placing or attaching the timing circuitry on a substrate or a circuit board. In some embodiments, providing the timing circuitry can include forming the timing circuitry, such as using wafer-level or semiconductor manufacturing processes.

At block 604, the method 600 can include electrically connecting (e.g., via wires, traces, or other conductors) multiple input signals to each clock circuit. For example, input ports of the first clock circuit 322 of FIG. 3 can be connected to the first strobe signal 211 of FIG. 2 and the second strobe signal 212 of FIG. 2, and the output port can be configured to generate/send the first clock signal 312 of FIG. 3. Similarly, input ports of the second clock circuit 324 of FIG. 3 can be connected to the third strobe signal 21 of FIG. 23 and the fourth strobe signal 214 of FIG. 2, and the output port can be configured to generate/send the second clock signal 314 of FIG. 3. Also, input ports of the third clock circuit 326 of FIG. 3 can be connected to the fifth strobe signal 215 of FIG. 2 and the sixth strobe signal 216 of FIG. 2, and the output port can be configured to generate/send the third clock signal 316 of FIG. 3.

At block 606, the method 600 can include providing a latching circuit (the grouped latching circuit 304 of FIG. 3). For example, the grouped latching circuit 304 can be provided with the first group latch 342 of FIG. 3, the second group latch 344 of FIG. 3, the third group latch 346 of FIG. 3, etc. that are each dedicated to a grouping of the data portions/bits. In some embodiments, the first group latch 342 can be configured to latch/process the first nibble of the data input set 250 based/triggered on the first clock signal 312. Similarly, the second group latch 344 can be configured to latch/process the second/next nibble of the data input set 250 based/triggered on the second clock signal 314. Also, the third group latch 346 can be configured to latch/process the third/next nibble of the data input set 250 based/triggered on the third clock signal 316.

Providing the latching circuit can be similar to providing the timing circuitry. For example, providing the latching circuit can include placing or attaching the latching circuit on a substrate or a circuit board. Also, providing the latching circuit can include forming the latching circuitry, such as using wafer-level or semiconductor manufacturing processes.

At block 608, the method 600 can include electrically connecting (e.g., vial wires, traces, or other conductors) the grouped latching circuit 304 to the timing circuit 302. For example, input ports of the first group latch 342 can be connected to the output port of the first clock circuit 322 and receive the first clock signal 312. Similarly, input ports of the second group latch 344 can be connected to the output port of the second clock circuit 324 and receive the second clock signal 314. Also, input ports of the third group latch 346 can be connected to the output port of the third clock circuit 326 and receive the third clock signal 316.

At block 610, the method 600 can include electrically connecting (e.g., vial wires, traces, or other conductors) the grouped latching circuit 304 to data/payload (e.g., read/write data, address, command, etc.). Multiple data portions/bits can be connected to each group latch within the grouped latching circuit 304. For example, input ports of the first group latch 342 can be connected to receive the first data 251 and the second data 252. Similarly, input ports of the second group latch 344 can be connected to receive the third data 253 and the fourth data 254. Also, input ports of the third group latch 346 can be connected to receive the fifth data 255 and the sixth data 256.

For illustrative purposes, the various embodiments have been discussed/illustrated using a write data path. However, it is understood that the disclosed technology can be implemented for a read data path. Similarly, the disclosed technology can be implemented for a command path, an address path, etc. for read operations and/or write operations.

Figure 7:
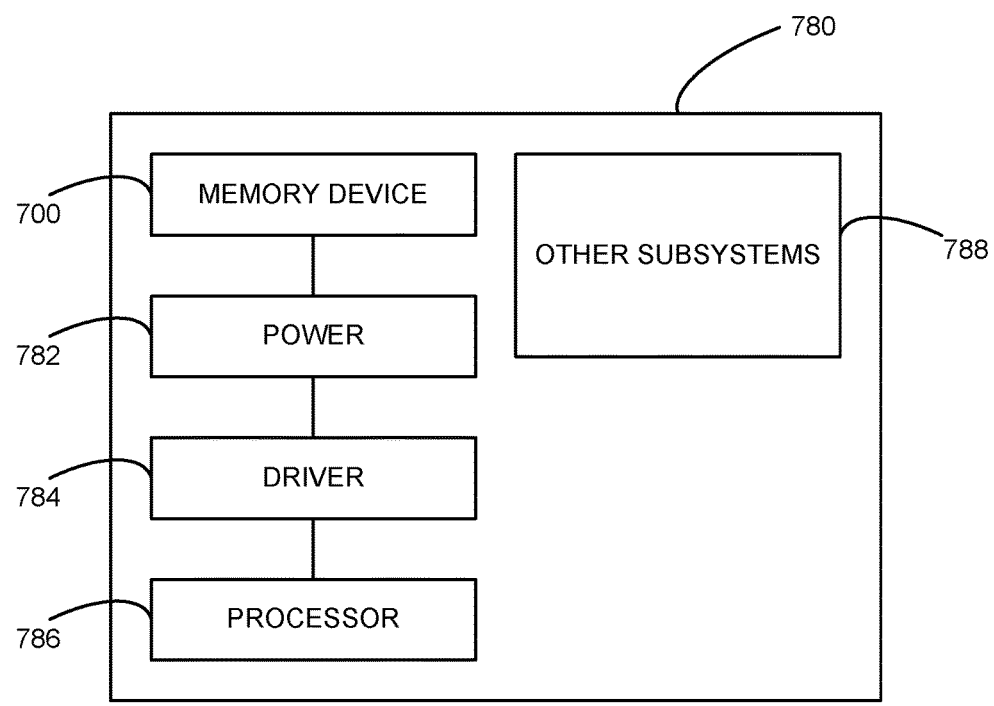
FIG. 7 is a schematic view of a system that includes a memory device in accordance with an embodiment of the present technology.

FIG. 7 is a schematic view of a system that includes a memory device in accordance with embodiments of the present technology. Any one of the foregoing memory devices described above with reference to FIGS. 3-6 can be incorporated into any of a myriad of larger and/or more complex systems, a representative example of which is system 780 shown schematically in FIG. 7. The system 780 can include a memory device 700, a power source 782, a driver 784, a processor 786, and/or other subsystems or components 788. The memory device 700 can include features generally similar to those of the memory device described above with reference to FIGS. 3-6, and can therefore include various features for performing a direct read request from a host device. The resulting system 780 can perform any of a wide variety of functions, such as memory storage, data processing, and/or other suitable functions. Accordingly, representative systems 780 can include, without limitation, hand-held devices (e.g., mobile phones, tablets, digital readers, and digital audio players), computers, vehicles, appliances and other products. Components of the system 780 may be housed in a single unit or distributed over multiple, interconnected units (e.g., through a communications network). The components of the system 780 can also include remote devices and any of a wide variety of computer readable media.

From the foregoing, it will be appreciated that specific embodiments of the technology have been described herein for purposes of illustration, but that various modifications may be made without deviating from the disclosure. In addition, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

In the illustrated embodiments above, the memory devices have been described in the context of devices incorporating NAND-based non-volatile storage media (e.g., NAND flash). Memory devices configured in accordance with other embodiments of the present technology, however, can include other types of suitable storage media in addition to or in lieu of NAND-based storage media, such as NOR-based storage media, magnetic storage media, phase-change storage media, ferroelectric storage media, etc.

The term "processing" as used herein includes manipulating signals and data, such as writing or programming, reading, erasing, refreshing, adjusting or changing values, calculating results, executing instructions, assembling, transferring, and/or manipulating data structures. The term data structures includes information arranged as bits, words or code-words, blocks, files, input data, system generated data, such as calculated or generated data, and program data. Further, the term "dynamic" as used herein describes processes, functions, actions or implementation occurring during operation, usage or deployment of a corresponding device, system or embodiment, and after or while running manufacturer's or third-party firmware. The dynamically occurring processes, functions, actions or implementations can occur after or subsequent to design, manufacture, and initial testing, setup or configuration.

The above embodiments are described in sufficient detail to enable those skilled in the art to make and use the embodiments. A person skilled in the relevant art, however, will understand that the technology may have additional embodiments and that the technology may be practiced without several of the details of the embodiments described above with reference to FIGS. 3-7.

From the foregoing, it will be appreciated that specific embodiments of the technology have been described herein for purposes of illustration, but that various modifications may be made without deviating from the disclosure. In addition, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

We claim:

1. A memory device, comprising:
    a timing circuit configured to:
        receive an input signal, wherein the input signal is one signal within a group of input signals that are communicated according to a sequence with each of the input signals individually corresponding to a portion of data, and
        generate a timing signal based on the received input signal, wherein the timing signal corresponds to at least two portions of the data; and
    a grouped latching circuit coupled to the timing circuit, the group latch configured to:
        receive the timing signal and the at least two portions of the data, and
        latch the at least two portions of the data according to the timing signal, wherein:
            the at least two portions of the data correspond to the received input signal and at least one other signal within the group of input signals, and
            the grouped latching circuit does not directly receive the group of input signals.

2. The memory device of claim 1, wherein:
    the timing circuit is configured to:
        receive a first input signal and/or a second input signal sequentially following the first input signal, and
        generate the timing signal corresponding to a nibble of the data associated with the first input signal and the second input signal, wherein the nibble includes a first data bit that corresponds to the first input signal and a second data bit that corresponds to the second input signal; and
    the grouped latching circuit is configured to latch the nibble of the data directly based on the timing signal without directly receiving the first input signal and the second input signal.

3. The memory device of claim 2, wherein:
    the timing circuit includes:
        a first clock circuit configured to generate a first timing signal corresponding to the nibble of the data, and
        a second clock circuit configured to generate a second timing signal corresponding to a second nibble of the data associated with a third input signal and a fourth input signal, wherein the second nibble includes a third data bit that corresponds to the third input signal and a fourth data bit that corresponds to the fourth input signal; and
    the grouped latching circuit includes:
        a first group latch configured to latch the first data bit and the second data bit directly based on the first timing signal, and
        a second group latch configured to latch the third data bit and the fourth data bit directly based on the second timing signal,
    wherein:
        the first group latch and the second group latch are configured to latch without directly receiving the third input signal and the fourth input signal.

4. The memory device of claim 3, wherein:
    the timing circuit further includes a third clock circuit configured to generate a third timing signal corresponding to cyclic redundancy check (CRC) information, wherein the CRC information includes a first CRC bit that corresponds to a fifth input signal and a second CRC bit that corresponds to a sixth input signal; and
    the grouped latching circuit includes a third group latch configured to latch the first CRC bit and the second CRC bit directly based on the third timing signal,
    wherein:
        the group latching circuit is configured to latch without directly receiving the fifth input signal and the sixth input signal.

5. The memory device of claim 3, wherein the timing circuit is configured to:
    receive one or more pairs of consecutive input signals that are separated in time by an input separation; and
    generate the first and second timing signals according to a timing signal separation that is greater than the input separation.

6. The memory device of claim 3, wherein the timing circuit is configured to generate the first and second timing signals based on every other input signal.

7. The memory device of claim 1, wherein the timing circuit is configured to generate one or more timing signals based on last occurring input signal within each groupings of the input signals.

8. The memory device of claim 7, wherein the timing circuit is configured to ignore the input signals preceding the last signal in generating the one or more timing signals.

9. The memory device of claim 1, wherein the at least two input signals can be a set of data strobe (DQS) signals.

10. The memory device of claim 1, wherein the timing circuit and the group latching circuit are configured to process write data, read data, command data, address data, or a combination thereof.

11. The memory device of claim 1, wherein the timing circuit includes one or more phase splitters.

12. The memory device of claim 11, wherein the timing circuit does not include logic buffers.

13. The memory device of claim 1, wherein the memory device is a dynamic random-access memory (DRAM) device configured according to a double data rate (DDR) interfacing scheme.

14. The memory device of claim 1, wherein the memory device is a stacked device including a master die and a set of slave dies connected to each other using through silicon vias (TSVs).

15. A method of operating a memory device including a first die and a second die, the method comprising:
   receiving an input signal at a timing circuit, wherein the input signal is one signal within a group of input signals that are communicated according to a sequence with each of the input signals individually corresponding to a portion of data;
   using the timing circuit, generating a timing signal based on the received input signal, wherein the timing signal corresponds to at least two portions of the data;
   receiving the timing signal and the at least two portions of the data at a grouped latching circuit; and
   using the grouped latching circuit, latching the at least two portions of the data based on the timing signal and without directly receiving the group of input signals, wherein the at least two portions of the data correspond to the received input signal and at least one other signal within the group of input signals.

16. The method of claim 15, wherein:
   receiving the input signal includes receiving two or more of a first input signal, a second input signal, a third input signal, and a fourth input signal in sequence;
   generating the timing signal includes:
      generating a first timing signal corresponding to a first nibble of the data associated with the first input signal and the second input signal, wherein the nibble includes a first data bit that corresponds to the first input signal and a second data bit that corresponds to the second input signal, and
      generating a second timing signal corresponding to a second nibble of the data associated with a third input signal and a fourth input signal, wherein the second nibble includes a third data bit that corresponds to the third input signal and a fourth data bit that corresponds to the fourth input signal; and
   latching the at least two or more portions of the data includes, without directly using the first input signal, the second input signal, the third input signal, and the fourth input signal:
      latching a first data bit and a second data bit directly based on the first timing signal, and
      latching a third data bit and a fourth data bit directly based on the second timing signal.

17. The method of claim 16, wherein:
   receiving the at least two input signals includes receiving one or more pairs of consecutive input signals that are separated in time by an input separation; and
   generating the timing signal includes generating the first and second timing signals according to a timing signal separation that is greater than the input separation.

18. The method of claim 16, wherein generating the timing signal includes generating the first and second timing signals based on last occurring input signal within each grouping of the input signals.

19. The method of claim 18, wherein generating the timing signal includes ignoring the input signals preceding the last signal in generating the one or more timing signals.

20. The method of claim 15, wherein receiving the at least two input signals includes receiving a set of data strobe (DQS) signals.

* * * * *